United States Patent [19]

Matsumoto et al.

[11] Patent Number: 4,767,608

[45] Date of Patent: Aug. 30, 1988

[54] METHOD FOR SYNTHESIZING DIAMOND BY USING PLASMA

[75] Inventors: Seiichiro Matsumoto; Mototsugu Hino; Yusuke Moriyoshi; Takashi Nagashima; Masayuki Tsutsumi, all of Ibaraki, Japan

[73] Assignee: National Institute for Research in Inorganic Materials, Ibaraki, Japan

[21] Appl. No.: 109,509

[22] Filed: Oct. 19, 1987

[30] Foreign Application Priority Data

Oct. 23, 1986 [JP] Japan .............................. 61-252391

[51] Int. Cl.$^4$ ...................... C01B 31/06; C30B 25/10
[52] U.S. Cl. .......................... 423/446; 156/DIG. 68; 204/173; 427/39; 427/113
[58] Field of Search ............... 423/446; 156/DIG. 68; 204/173; 427/39, 113

[56] References Cited

U.S. PATENT DOCUMENTS

| 3,705,937 | 12/1972 | Dzevitsky et al. | 423/446 |
|---|---|---|---|
| 4,277,293 | 7/1981 | Nelson et al. | 423/446 |
| 4,434,188 | 2/1984 | Kamo et al. | 427/39 |
| 4,495,044 | 1/1985 | Banks | 423/446 |
| 4,504,519 | 3/1985 | Zelez | 423/446 |
| 4,663,183 | 5/1987 | Ovshinsky et al. | 427/39 |

FOREIGN PATENT DOCUMENTS

| 59-35092 | 2/1984 | Japan | 423/446 |
|---|---|---|---|
| 59-137311 | 8/1984 | Japan | 423/446 |
| 59-232991 | 12/1984 | Japan | 423/446 |
| 60-127293 | 7/1985 | Japan | 423/446 |
| 60-180999 | 9/1985 | Japan | 423/446 |
| 60-191097 | 9/1985 | Japan | 423/446 |

Primary Examiner—John Doll
Assistant Examiner—Robert M. Kunemund
Attorney, Agent, or Firm—Oblon, Fisher, Spivak, McClelland & Maier

[57] ABSTRACT

A method for synthesizing diamond, which comprises:
(a) generating a plasma by electric discharge in a gas selected from the group consisting of a hydrocarbon gas, hydrogen gas, an inert gas and a mixture thereof,
(b) decomposing a carbon source by the plasma to form plasma gas containing carbon ions or carbon radicals,
(c) effecting adiabatic expansion of the plasma gas to precipitate diamond.

14 Claims, 2 Drawing Sheets

METHOD FOR SYNTHESIZING DIAMOND BY USING PLASMA

BACKGROUND OF THE INVENTION

1. Field of the Invention

The present invention relates to a method for synthesizing diamond by using a plasma.

2. Discussion of Background

There have so far been known the following methods for synthesizing diamond in a thermodynamically metastable region by using electric discharge.

(1) An ion beam or ion plating method wherein carbon ions or hydrocarbon ions are produced by using electric discharge, and they are accelerated by a potential gradient and impinged against a substrate surface to precipitate diamond.

(2) An activated gas phase precipitation method wherein a gas mixture comprising a hydrocarbon and hydrogen is activated by a low temperature plasma produced by glow discharge, whereby diamond is precipitated on the surface of a substrate.

However, these methods have the following drawbacks.

Method (1) has an advantage that a diamond-like carbon film can be formed on the substrate surface made of various materials at a normal temperature. However, since accelerated ions are employed the formed diamond has many defects, and it is difficult to obtain diamond having good crystallinity. Further, since the ion beam density can hardly be increased, this method has a disadvantage that the precipitation rate is low.

Method (2) has an advantage that microcrystals of diamond can be formed on the substrate made of various materials. However, since a low temperature plasma produced by glow discharge is employed, it is difficult to generate such a plasma unless the gas pressure is as low as 0.3 atm or less. Further, the concentration of active species such as ions or radicals is as low as about 10% at the maximum. Thus, there has been a drawback that the rate of growth of diamond is slow (a few micrometers per hour at the maximum). The gas (ions, atoms, molecules) temperature in this low temperature plasma is about 1600° K. or lower.

Further, in each of methods (1) and (2), diamond can be formed only on a substrate, and it is impossible to form it in a gas phase in the form of a powder.

In order to overcome the drawbacks of the conventional method, the present inventors have previously developed a method for synthesizing diamond which comprises generating a high temperature plasma having a gas temperature of at least 1700° K. by means of a direct current, a low frequency, a high frequency or a microwave, and decomposing or evaporating an organic compound or a carbon material in the plasma to precipitate diamond, whereby not only a film-form diamond but also a bulk form diamond can be efficiently produced at a high growth rate of diamond (U.S. patent application Ser. No. 06/943,726)

According to this method, diamond can be obtained under high gas pressure at a high concentration of active species and at a high growth rate of diamond. However, due to the high gas temperature of the plasma, it is usually required to cool the substrate or the substrate holder by a cooling medium, or to control the temperature of the precipitation zone by blowing a gas or a cooling medium. Such a temperature control tends to lead to a non-uniformity of the substate temperature or the precipitation zone temperature, and the temperature control is difficult.

SUMMARY OF THE INVENTION

The present invention is intended to overcome the drawbacks of the above-mentioned method. It is an object of the present invention to provide a method for synthesizing diamond, whereby the substrate temperature and the precipitation zone temperature can readily be controlled to a uniform temperature to obtain a film-form or bulk crystal-form diamond having uniform properties, or a fine powder-form diamond having a uniform particle size and properties.

The present inventors have conducted extensive researches to achieve the object and have found that when the gas obtained in a plasma state is adiabatically expanded, the gas can be rapidly and uniformly cooled, and the substarate temperature and the precipitation zone temperature can be readily controlled to a uniform level. The present invention has been accomplished on the basis of this discovery.

The present invention provides a method for synthesizing diamond, which comprises:

(a) generating a plasma by electric discharge in a gas selected from the group consisting of a hydrocarbon gas, a hydrogen gas, an inert gas and a mixture thereof, (b) decomposing a carbon source by the plasma to form a plasma gas containing carbon ions or carbon radicals, and (c) effecting adiabatic expansion of the plasma gas to precipitate diamond.

BRIEF DESCRIPTION OF THE DRAWINGS

The drawings diagrammatically illustrate various apparatus for carrying out the method of the present invention.

DETAILED DESCRIPTION OF THE PREFERRED EMBODIMENTS

Figure 1:
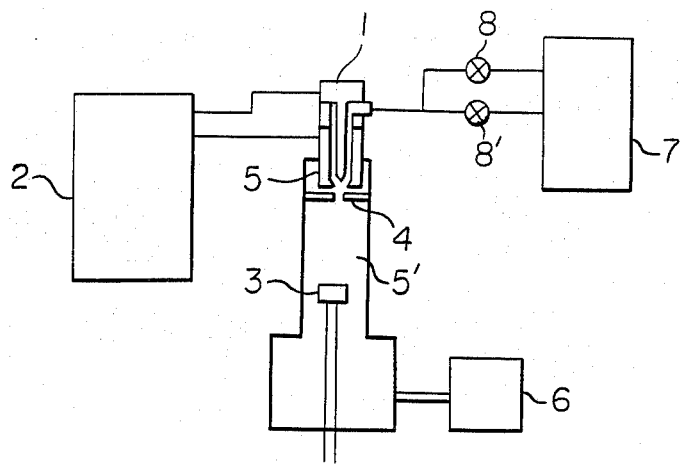
FIG. 1 is a view illustrating an apparatus whereby the synthesis of diamond is conducted by generating a plasma by direct current discharge.

The adiabatic expansion is effected in such a manner that a gas in the plasma state which is obtained by decomposing or evaporating a carbon source in the plasma is discharged from a nozzle or an orifice to a low pressure zone to permit rapid expansion of the volume. Here, the carbon source may be an organic compound or carbon material capable of being decomposed to form carbon ions or carbon radicals in the plasma.

In the present invention, a low temperature plasma produced by glow discharge can be also employed as the plasma. However, it is preferred to employ a high temperature plasma, in which the pressure and the concentration of active species are high, whereby the effect of the adiabatic expansion is large. Here, the high temperature plasma is a plasma in such a state that the excitation of chemical species in the plasma is caused by a combination of a mechanism of the impingement of chemical species with electrons accelerated by the electric field and a mechanism of the collision of thermodynamically activated chemical species themselves, in which the gas temperature is at least about 1700° K., preferably above 2000° K.

The plasma is generted by elecric discharge and the power source employed for the electric discharge may be of a direct current, a low frequency alternate current, a high frequency or a microwave, with or without electrodes.

As the gas used for the generation of the plasma in the present invention, a hydrocarbon gas, an inert gas and a hydrogen gas may be employed alone or in combination as a gas mixture.

When an inert gas or a hydrogen gas is employed as the plasma-generating gas, it is necessary to inject a carbon source such as an organic compound or a carbon material into the plasma as a separate starting material.

The organic compound may be gaseous, liquid or solid so long as it is capable of being decomposed and forming ion species or radical species including carbon. For instance, there may be mentioned a hydrocarbon such as methane, ethane, propane, butane, ethylene, or benzene, or a polymer substance such as polyethylene, polypropylene or polystyrene. Further, an organic compound containing oxygen, nitrogen, halogen, sulfur or phosphorus in the molecule, such as an alcohol, acetone, an amine, methyl chloride, thiophene or triethyl phosphine may be employed.

When the plasma-generating gas contains hydrogen, a carbon source such as carbon monoxide or carbon dioxide may also be employed.

As the carbon material, graphite may be employed.

The pressure of the plasma-generating gas is usually within a range of from $10^{-4}$ to $5 \times 10^2$ atm. The lower the pressure, the slower the precipitation rate of diamond. The higher the pressure, the more cumbersome the handling of the pressure container becomes. The pressure in the precipitation chamber is usually within a range of from $10^{-6}$ to 10 atm. In order to obtain a film-form diamond, the pressure is preferably from $10^{-6}$ to 1 atm, and in order to obtain a bulk-form or powder-form diamond, the pressure is preferably from $10^{-2}$ to 10 atm. The plasma-generating chamber and the precipitation chamber can be evacuated independently by differential pumping.

The size of the nozzle or orifice may vary depending on the flow rate of the gas and the gas pressures of the primary and secondary sides. Within the above-mentioned ranges of the pressures, the diameter and the length of the nozzle hole or orifice are preferably from 0.5 to 20 mm and from 0.3 to 30 mm, respectively. There may be one or a plurality of nozzle holes or orifices. Further, the nozzle or orifice may be cooled with water, if necessary.

As the substrate, there may be employed a metal such as molybdenum or stainless steel, a semiconductor such as silicon, a ceramics such as alumina, a diamond single crystal, etc. The temperature of the substrate is preferably from 400° to 1700° C. The substrate is heated by the gas from the nozzle or orifice. If necessary, however, the temperature of the substrate may be controlled by additional heating with a heater or by cooling with a cooling medium or a gas.

Figure 3:
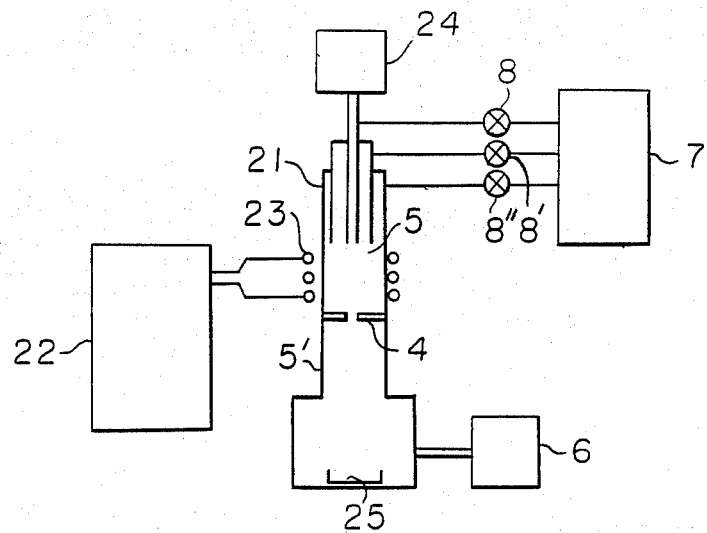
FIG. 3 is a view illustrating a further apparatus wherein the plasma is generated by high frequency discharge.
Figure 4:
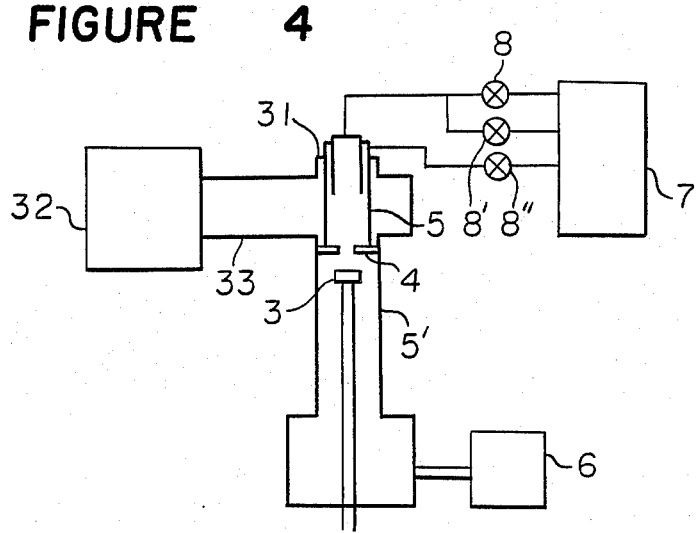
FIG. 4 is a view illustrating a still further apparatus wherein the plasma is generated by microwave discharge.

The apparatus for carrying out the method of the present invention will be described with reference to the accompanying drawings. FIG. 1 shows a diagrammatic view of an apparatus for synthesizing diamond wherein the high temperature plasma is generated by a direct current electric discharge, FIG. 2 is a diagrammatic view of an apparatus wherein an alternate current discharge is used for the generation of the high temperature plasma, FIG. 3 is a diagrammatic view of an apparatus wherein a high frequency discharge is used for the generation of the high temperature plasma, and FIG. 4 shows a diagrammatic view of an apparatus wherein a microwave discharge is used for the generation of the high temperature plasma.

Referring to FIG. 1, reference numeral 1 is a direct current plasma torch, numeral 2 designates a direct current power source, numeral 3 indicates a substrate, numeral 4 is a nozzle or an orifice, numeral 5 indicates a plasma generating chamber, numeral 5' is a precipitation chamber, numeral 6 indicates an evacuation device, numeral 7 indicates a device for supplying gases, and numerals 8 and 8' indicate valves for controlling flow rates of gases.

Firstly, by the evacuation device 6, the chambers 5 and 5' are evacuated, and then an organic compound gas and a plasma-generating gas are supplied through valves 8 and 8', respectively. After the precipitation chamber 5' is adjusted to a prescribed pressure, a power is supplied from the power source 2 to the plasma torch 1 to generate a plasma, which is then discharged to the precipitation chamber 5' through the nozzle or orifice 4. Diamond is precipitated onto the substrate 3 by controlling the position of the holder of the substrate 3. As shown in FIG. 3, it is also possible to synthesize a powder-form diamond in a gas phase by omitting the substrate and the substrate holder.

Figure 2:
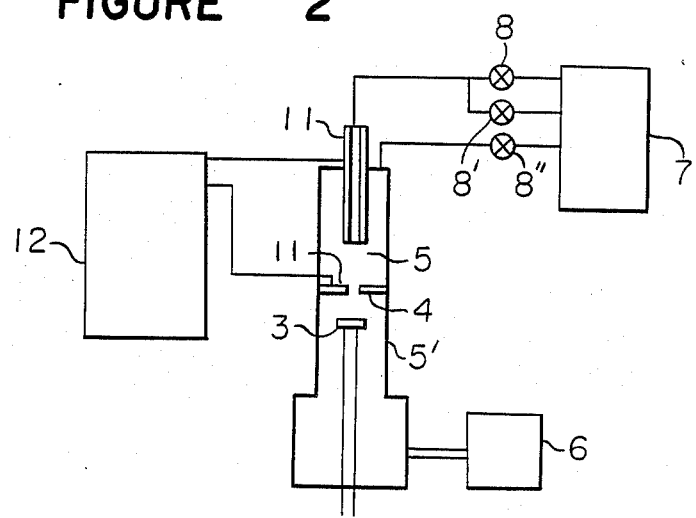
FIG. 2 is a view illustrating another apparatus wherein the plasma is generated by alternate current discharge.

In FIG. 2, reference numerals 11 designate electrodes for alternate current discharge. The electrode located below has a hole in the center and thus serves also as a nozzle. Reference numeral 12 is an alternate current power source. Other numerals are as defined above with respect to FIG. 1. The operation procedure is the same as in the case of the direct current discharge. Namely, the plasma gas generated by electric discharge between the electrodes is discharged to the precipitation chamber 5' through the nozzle or orifice and diamond is grown on the substrate or in the gas phase. Thus, in the case of using electric discharge with the electrodes, one of the electrodes may be used also as the nozzle or orifice.

In FIG. 3, reference numeral 21 is a high frequency plasma torch, numeral 22 is a high frequency power source, numeral 23 is a work coil, numeral 24 is a device for supplying a solid starting material, numeral 25 is a receptacle for diamond powder formed, and other numerals are as defined above with respect to FIG. 1. The plasma can be generated by the capacity combination using electrodes instead of the work coil 23. Also in this case, the plasma gas generated is discharged to the precipitation chamber 5' through a nozzle or orifice to form a fine powder of diamond. Further, film-form or bulk-form diamond can be obtained by placing a substrate as shown in FIG. 1.

In FIG. 4, reference numeral 31 is a microwave plasma torch, numeral 32 is a microwave oscillator, numeral 33 is a microwave wave guide, and other numerals are as defined above with respect to FIG. 1. As in the case of FIG. 1, diamond can be grown on the substrate or in the gas phase. Further, instead of the cavity resonator type plasma torch shown in FIG. 4, a co-axial electrodes type plasma torch can be used.

Now, the present invention will be described in detail with reference to Examples. However, it should be understood that the present invention is by no means restricted by these specific Examples.

EXAMPLE 1

By using the apparatus as shown in FIG. 1, electric discharge was conducted for 10 minutes at 45 V at 78 A while supplying 100 ml/min of methane and 10 liter/min of argon from valves 8 and 8', respectively, whereby a polycrystalline film of diamond having a thickness of 4 $\mu$m was obtained on a silicon substrate of 0.9 cm$^2$. The diameter of the nozzle was 1 mm, the pressure of the precipitation chamber was 8 Torr. The substrate was simply placed on an alumina holder and the substrate temperature was about 750° C. The identification of the structure of the diamond film was conducted by X-ray diffraction and Raman scattering spectroscopy. The uniformity of the thickness of the film was within ±10%.

EXAMPLE 2

By using the apparatus as shown in FIG. 2, electric discharge was conducted for 10 minutes at 85 V at 90 A at 50 Hz, while supplying 200 ml/min of methane from the valve 8, 12 liter/min of argon from the valve 8' and 8 liter/min of hydrogen from the valve 8", whereby a polycrystalline film having a thickness of 7 $\mu$m was formed on a molybdenum substrate. The diameter of the nozzle was 3 mm, the pressure of the precipitation chamber was 0.2 atm., and the substrate temperature was 920° C.

EXAMPLE 3

By using the apparatus as shown in FIG. 3 (a substrate holder was placed), electric discharge was conducted for 9 minutes at a high frequency of 4 MHz with an input of 12 kW at the vacuum tube plate of the oscillator, while supplying a gas mixture of 0.6 g/min of methanol vapor and 2 liter/min of argon from the valve 8, 10 liter/min of argon from the valve 8' and a gas mixture of 16 liter/min of argon and 8 liter/min of hydrogen from the valve 8", whereby a diamond film having a thickness of 18 $\mu$m was formed on a molybdenum substrate. The diameter of the nozzle was 9.6 mm, the pressure of the precipitation chamber was 0.6 atm., and the substrate temperature was 1100° C.

EXAMPLE 4

By using the apparatus as shown in FIG. 3, electric discharge was conducted for 30 minutes with an input of 70 kW at the vacuum tube while supplying a gas mixture of 400 ml/min of propane and 4 liter/min of argon from the valve 8, 25 liter/min of argon from the valve 8' and a gas mixture of 25 liter/min of argon and 10 liter/min of hydrogen from the valve 8", whereby about 0.1 g of diamond powder having a particle size of 100–300 Å were formed on the receptacle 25. The diameter of the nozzle was 2 mm, the pressure of the precipitation chamber was 0.1 atm., and the pressure of the electric discharge chamber was about 3 atm.

EXAMPLE 5

By using the apparatus as shown in FIG. 4, electric discharge was conducted by a microwave generated at 2.45 GHz with 4.7 kW while supplying a gas mixture of 100 ml/min of methane and 2 liter/min of argon from the valve 8, 3 liter/min of argon from the valve 8' and a gas mixture of 10 liter/min of argon and 3.5 liter/min of hydrogen from the valve 8", whereby a diamond film having a thickness of about 7 $\mu$m was formed on a silicon substrate. The diameter of the nozzle was 3 mm, the pressure of the precipitation chamber was 0.1 atm., and the substrate temperature was 890° C.

The method of the present invention provides such an excellent effect that even in a method for synthesizing diamond by using a high temperature plasma, it is unnecessary to cool the substrate with water or by blowing a gas, or to cotrol the temperature of the precipitatin zone by blowing a gas, and a uniform distribution of the crystal-growth temperature can be obtained, whereby a film-form or crystal-form diamond having uniform properties or a fine powder-form diamond having uniform particle size can be obtained.

What is claimed is:

1. A method for synthesizing diamond, which comprises:
   (a) generating a plasma by electric discharge in a gas selected from the group consisting of a hydrocarbon gas, a hydrogen gas, an inert gas and a mixture thereof,
   (b) decomposing a carbon source by the plasma to form a plasma gas containing carbon ions or carbon radicals, and
   (c) effecting adiabatic expansion of the plasma gas to precipitate diamond.

2. The method according to claim 1, wherein the adiabatic expansion is conducted by discharging the plasma gas from a nozzle or an orifice into a low pressure zone.

3. The method according to claim 1, wherein the diamond is precipitated in a gas phase.

4. The method according to claim 1, wherein the diamond is precipitated onto a substrate.

5. The method according to claim 1, wherein the inert gas is argon or helium.

6. The method according to claim 1, wherein the carbon source is an organic compound or carbon material capable of being decomposed to form carbon ions or carbon radicals in the plasma.

7. The method according to claim 1, wherein the carbon source is a hydrocarbon, a polymer, an oxygen, nitrogen, halogen, sulfur or phosphorus-containing organic compound, carbon monoxide, carbon dioxide, or graphite.

8. The method according to claim 1, wherein the carbon source is methane, ethane, propane, butane, ethylene, benzene, polyethylene, polypropylene, an alcohol, acetone, an amine, methyl chloride, thiophene or triethyl phosphine.

9. The method according to claim 1, wherein the plasma is generated at a gas pressure of from $10^{-4}$ to $5 \times 10^2$ atm.

10. The method according to claim 1, wherein the diamond is precipitated at a gas pressure of from $10^{-6}$ to 10 atm.

11. The method according to claim 1, wherein the gas temperature of the plasma is at least 1700° K.

12. A method according to claim 2, the nozzle or the orifice has a diameter of from 0.5 to 20 mm and a length of from 0.3 to 30 mm.

13. The method according to claim 3, wherein said gas phase is maintained at a temperature of from 400° to 1700° C.

14. The method according to claim 4, wherein the substrate is maintained at a temperature of from 400° to 1700° C.

* * * * *